United States Patent
Zhang et al.

(10) Patent No.: US 9,646,865 B1
(45) Date of Patent: May 9, 2017

(54) INTERCONNECTION STRUCTURE, FABRICATING METHOD THEREOF, AND EXPOSURE ALIGNMENT SYSTEM

(71) Applicants: Semiconductor Manufacturing International (Beijing) Corporation, Bejing (CN); Semiconductor Manufacturing International (Shanghai) Corporation, Shanghai (CN)

(72) Inventors: Qiang Zhang, Shanghai (CN); Bin Xing, Shanghai (CN); Jing An Hao, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/335,003

(22) Filed: Oct. 26, 2016

(30) Foreign Application Priority Data

Nov. 5, 2015 (CN) .......................... 2015 1 0746891

(51) Int. Cl.
*H01L 21/00* (2006.01)
*H01L 21/68* (2006.01)
(Continued)

(52) U.S. Cl.
CPC ............ *H01L 21/68* (2013.01); *G03F 9/7015* (2013.01); *H01L 21/027* (2013.01);
(Continued)

(58) Field of Classification Search
CPC ............... H01L 21/68; H01L 21/76892; H01L 21/76834; H01L 23/544; H01L 22/20;
(Continued)

(56) References Cited

U.S. PATENT DOCUMENTS 5,621,813 A * 4/1997 Brown ...................... G03F 7/70
  348/95
6,362,491 B1 * 3/2002 Wang .................. G03F 7/70633
  250/548

(Continued)

*Primary Examiner* — Richard Booth
(74) *Attorney, Agent, or Firm* — Anova Law Group, PLLC

(57) ABSTRACT

In some embodiments, an interconnection structure, an exposure alignment system, and a fabricating method thereof are provided. The method comprises: providing a wafer, forming a first to-be-connected member and multiple first alignment members in a first conductive layer; form a first opening and multiple second alignment members in a first mask layer, the first opening is used to define a position of a second to-be-connected member; based on reference and measurement coordinates of the first alignment members, and reference coordinates and measurement coordinates of the second alignment members, obtaining wafer coordinates for characterizing a position deviation of the wafer; obtaining adjustment compensation values according to stacking offsets of a preceding wafer; adjusting a position of the wafer; forming the interconnection structure in a first dielectric layer and a second dielectric layer to electrically interconnect the first to-be-connected member and the second to-be-connected member.

20 Claims, 10 Drawing Sheets

(51) Int. Cl.
*H01L 21/768* (2006.01)
*H01L 23/544* (2006.01)
*H01L 21/66* (2006.01)
*H01L 21/687* (2006.01)
*H01L 21/67* (2006.01)
*H01L 21/027* (2006.01)
*G03F 9/00* (2006.01)

(52) U.S. Cl.
CPC .. *H01L 21/67259* (2013.01); *H01L 21/68714* (2013.01); *H01L 21/76834* (2013.01); *H01L 21/76892* (2013.01); *H01L 22/20* (2013.01); *H01L 23/544* (2013.01); *H01L 2223/54426* (2013.01)

(58) Field of Classification Search
CPC ......... H01L 21/68714; H01L 21/67259; G03F 9/7015
See application file for complete search history.

(56) References Cited

U.S. PATENT DOCUMENTS

| | | | |
|---|---|---|---|
| 6,532,056 B2 * | 3/2003 | Osakabe | G03F 9/7088 355/53 |
| 2002/0094679 A1 * | 7/2002 | Song | H01L 23/544 438/666 |

* cited by examiner

INTERCONNECTION STRUCTURE, FABRICATING METHOD THEREOF, AND EXPOSURE ALIGNMENT SYSTEM

CROSS-REFERENCES TO RELATED APPLICATIONS

This application claims the priority of Chinese patent application No. 201510746891.X, filed on Nov. 5, 2015, the entire content of which is incorporated herein by reference.

TECHNICAL FIELD

The present disclosure generally relates to the field of semiconductor technologies and, more particularly, relates to an interconnection structure, a method for fabricating the interconnection structure, and an exposure alignment system used for fabricating the interconnection structure.

BACKGROUND

With the development from integrated circuits to large scale integrated circuits, the circuit density of the integrated circuits are increasing. In order to improve the integration of devices, the semiconductor chips generally have a multi-layer semiconductor structure. Different layers of the semiconductor structure can be electrically connected by using interconnection structures.

Referring to FIGS. 1 to 4, cross sectional structures of an existing interconnection structure corresponding to certain stages of an existing fabricating process are shown.

As shown in FIG. 1, a substrate 10 is formed. The substrate 10 includes a first to-be-connected member ma, and a low-k dielectric layer 11 covering the first to-be-connected member ma. A patterned dielectric layer 20 is formed on a surface of the substrate 10. The patterned dielectric layer 20 has a first opening 21. The first opening 21 is used for defining a position of a second to-be-connected member.

As shown in FIG. 2, the first opening 21 is filled with a dielectric material to form an oxidized dielectric layer 50. A patterned photoresist layer 60 is formed over the oxidized dielectric layer 50. The patterned photoresist layer 60 has a second opening 61 formed above the first to-be-connected member ma. The second opening 61 is used for defining a position of a plug that interconnects the first to-be-connected member ma and the second to-be-connected member.

Referencing to FIGS. 3 and 4, multiple etching processes can be performed to etch the oxide dielectric layer 50 and the low-k dielectric layer 11 to form a third opening in the low-k dielectric layer 11. The third opening includes a groove 12 for forming the second to-be-connected member and a contact hole 13 for forming the plug. Thereafter, the contact holes 13 and the trenches 12 are successively filled with the conductive material to form the plug va and the second to-be-connected member ma+1.

However, the plug va in the interconnection structure formed by using the existing fabricating method may easily deviate from the position of the first to-be-connected member ma. As such, a distance between the plug va and a device mb in the substrate 10 that is adjacent to the first to-be-connected member ma may be too small. Thus, a bridging or even a short-circuiting may be generated between the plug va and the device mb, thereby affecting the performance of the formed semiconductor device.

BRIEF SUMMARY

In accordance with some embodiments of the disclosed subject matter, an interconnection structure, a method for fabricating the interconnection structure, and an exposure alignment system used for the fabricating interconnection structure are provided.

One aspect of the disclosed subject matter provides a method for fabricating an interconnection structure, comprising: providing a wafer, wherein a first conductive layer is formed on a surface of the wafer; patterning the first conductive layer to form a first to-be-connected member and a plurality of first alignment members in the first conductive layer; obtaining reference coordinates and measurement coordinates of the plurality of first alignment members; forming a first dielectric layer covering the wafer and the first to-be-connected member, and forming a first mask layer on the first dielectric layer; pattering the first mask layer to form a first opening and a plurality of second alignment members in the first mask layer, wherein the first opening is used to define a position of a second to-be-connected member; obtaining reference coordinates and measurement coordinates of the plurality of second alignment members; forming a second dielectric layer filling the first opening and covering the first mask layer, and forming a second mask layer on the second dielectric layer; based on the reference coordinates and the measurement coordinates of the plurality of first alignment members, as well as the reference coordinates and the measurement coordinates of the plurality of second alignment members, obtaining wafer coordinates for characterizing a position deviation of the wafer; obtaining adjustment compensation values according to stacking offsets between a first to-be-connected member, a second to-be-connected member and an interconnection structure of a preceding wafer; adjusting a position of the wafer according to the wafer coordinates and the adjustment compensation values; after adjusting the position of the wafer, patterning the second mask layer to form a second opening in the second mask layer; and using the second opening to form the interconnection structure in the first dielectric layer and the second dielectric layer, wherein the interconnection structure electrical interconnects the first to-be-connected member and the second to-be-connected member.

In some embodiments, the first conductive layer is patterning by using a first photomask including a first mask pattern, wherein the first mask pattern including a first connecting pattern for forming the first to-be-connected member, and a plurality of first alignment marks for forming the plurality of first alignment members; and the first mask layer is patterning by using a second photomask including a second mask pattern, wherein the second mask pattern including a second connecting pattern for forming the first opening, and a plurality of second alignment marks for forming the plurality of second alignment members.

In some embodiments, a number of the plurality of first alignment marks is equal to a number of the plurality of first alignment members, which is not less than three; a number of the plurality of second alignment marks is equal to a number of the plurality of second alignment members, which is not less than three; and the number of the plurality of first alignment members is equal to the number of the plurality of second alignment members.

In some embodiments, the reference coordinates of the plurality of first alignment members are obtained by measuring position coordinates of the plurality of first alignment marks in the first mask plate; the measurement coordinates of the plurality of first alignment members are obtained by measuring position coordinates of the plurality of first alignment members in the first conductive layer; the reference coordinates of the plurality of second alignment members are obtained by measuring position coordinates of the plurality of second alignment marks in the second mask plate; and the measurement coordinates of the plurality of second alignment members are obtained by measuring position coordinates of the plurality of second alignment members in the first mask layer.

In some embodiments, the wafer is placed on a wafer stage, and a plurality of dicing lines are provided on the wafer; a wafer stage coordinate system is established by using a center of the wafer stage as an original point, and using two lines respectively parallel to two dicing lines that are perpendicular to each other an X axis and a Y axis; and the reference coordinates and the measurement coordinates of the plurality of first alignment members, and the reference coordinates and the measurement coordinates of the plurality of second alignment members are represented by using the wafer stage coordinate system.

In some embodiments, obtaining wafer coordinates comprises: establishing a set of linear equations based on the reference coordinates and the measurement coordinates of the plurality of first alignment members, the reference coordinates and the measurement coordinates of the plurality of second alignment members, and the wafer coordinates; and obtaining the wafer coordinates by solving the set of linear equations; wherein the wafer coordinates include at least a lateral coordinate, an enlarged coordinate, and a rotational coordinate.

In some embodiments, the set of linear equations are solved by using a least squares method.

In some embodiments, obtaining adjustment compensation values comprises: measuring a first stacking offset between the first to-be-connected member and the interconnection structure of the preceding wafer by using an overlapping pair measuring instrument; measuring a second stacking offset between the second to-be-connected member and the interconnection structure of the preceding wafer by using the overlapping pair measuring instrument; and obtaining the adjustment compensation values based on the first stacking offset and the second stacking offset by using an advanced process control system.

In some embodiments, the adjustment compensation values comprises: a wafer lateral shift adjustment compensation value configured to compensate a horizontal displacement between the wafer and the wafer stage in a linear direction in a wafer stage plane; a wafer enlargement adjustment compensation value configured to compensate a vertical displacement between the wafer and the wafer stage in a direction perpendicular to the wafer stage plane; a wafer rotation adjustment compensation value configured to compensate a rotational angle between the wafer and the wafer stage; a single exposure rotation compensation value configured to compensate a rotational angle between the wafer and the wafer stage during each exposure process; and a single exposure enlargement compensation value configured to compensate a vertical displacement between the wafer and the wafer stage in the direction perpendicular to the wafer stage plane during each exposure process.

Another aspect of the disclosed subject matter provides an exposure alignment system for forming an interconnection structure, comprising: a wafer module, configured for: providing a wafer, wherein a first conductive layer is formed on a surface of the wafer; patterning the first conductive layer to form a first to-be-connected member and a plurality of first alignment members in the first conductive layer; obtaining reference coordinates and measurement coordinates of the plurality of first alignment members; forming a first dielectric layer covering the wafer and the first to-be-connected member, and forming a first mask layer on the first dielectric layer; pattering the first mask layer to form a first opening and a plurality of second alignment members in the first mask layer, wherein the first opening is used to define a position of a second to-be-connected member; obtaining reference coordinates and measurement coordinates of the plurality of second alignment members; forming a second dielectric layer filling the first opening and covering the first mask layer, and forming a second mask layer on the second dielectric layer; and obtaining wafer coordinates for characterizing a position deviation of the wafer based on the reference coordinates and the measurement coordinates of the plurality of first alignment members, as well as the reference coordinates and the measurement coordinates of the plurality of second alignment members; a compensation module, configured for obtaining adjustment compensation values according to stacking offsets between a first to-be-connected member, a second to-be-connected member and an interconnection structure of a preceding wafer; and an adjustment module connected with the wafer module and the compensation module, configured for: receiving the wafer coordinates from the wafer module; receiving the adjustment compensation values from the compensation module; and adjusting a position of the wafer according to the wafer coordinates and the adjustment compensation values.

Other aspects of the disclosed subject matter can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like members. It should be noted that the following drawings are merely examples for illustrative purposes according to various disclosed embodiments and are not intended to limit the scope of the present disclosure.

DETAILED DESCRIPTION

Figure 1:
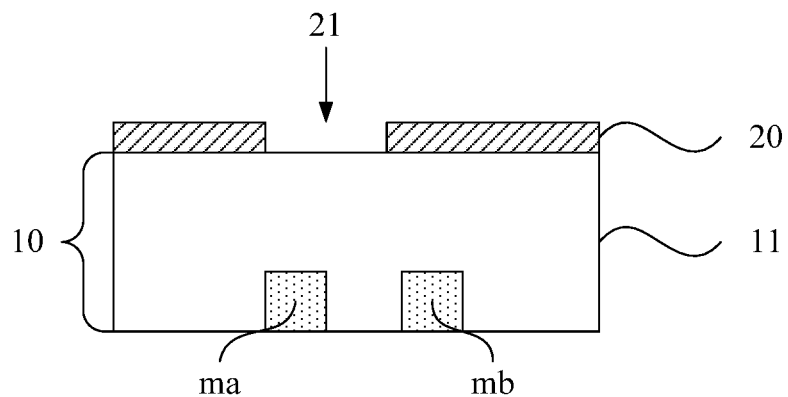
FIGS. 1-6 illustrate cross sectional structures of an existing interconnection structure corresponding to certain stages of an existing fabricating process.

Various objects, features, and advantages of the disclosed subject matter can be more fully appreciated with reference to the following detailed description of the disclosed subject matter when considered in connection with the following drawings, in which like reference numerals identify like members. It should be noted that the following drawings are merely examples for illustrative purposes according to various disclosed embodiments and are not intended to limit the scope of one disclosure.

It is apparent that the described embodiments are some but not all of the embodiments of the present invention. Based on the disclosed embodiments, persons of ordinary skill in the art may derive other embodiments consistent with the present disclosure, all of which are within the scope of the present invention.

As described in the background section, the existing fabricating process can cause a problem that the plug va in the interconnection structure can easily deviate from the position of the first to-be-connected member ma. A reason of the deviation problem can be analyzed as follows in connection with the formation of the plug va.

Figure 2:
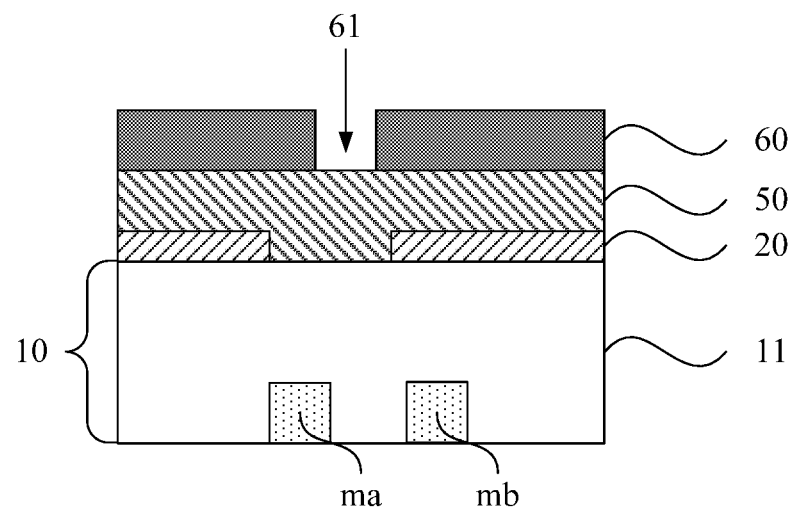
Figure 3:
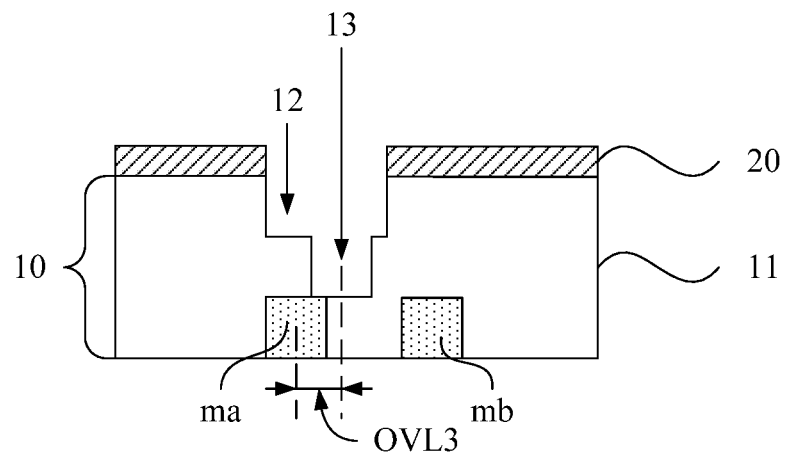
Figure 4:
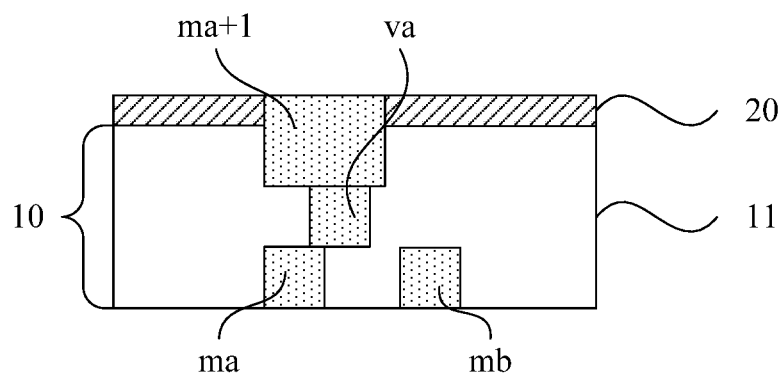

Referring to FIGS. 1 and 2, in the existing fabricating process, after forming the first opening 21 for defining the position of the second to-be-connected ma+1, the second opening 61 is formed to define the position of the plug va that can interconnect the first to-be-connected member ma and the second to-be-connected member ma+1.

Figure 5:
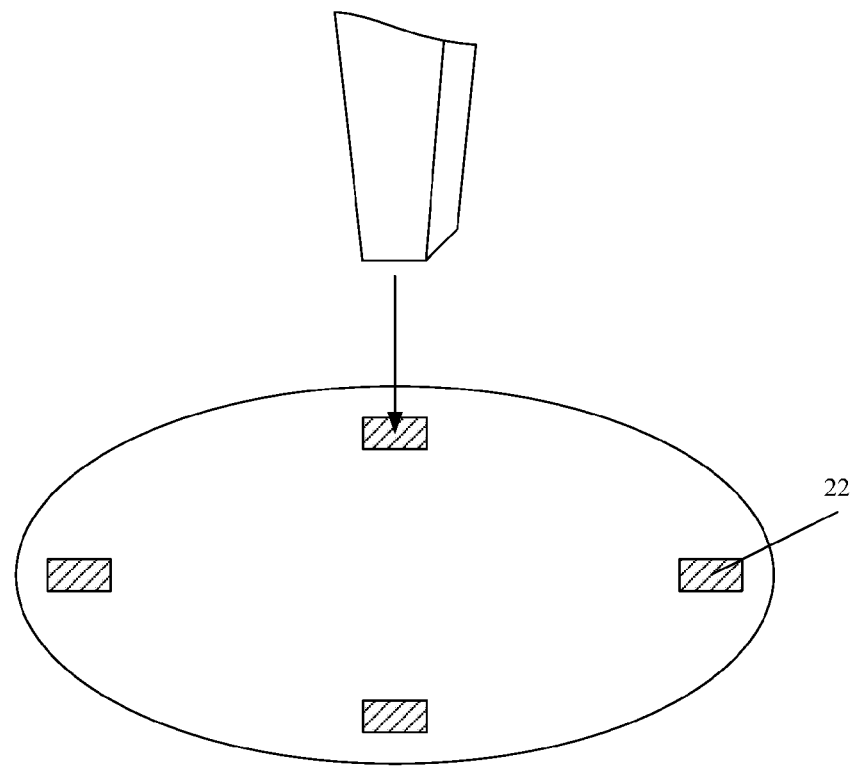
Figure 6:
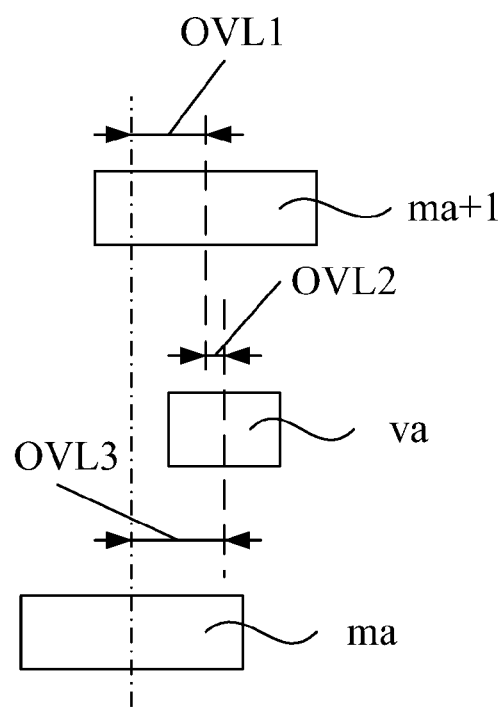
Figure 7:
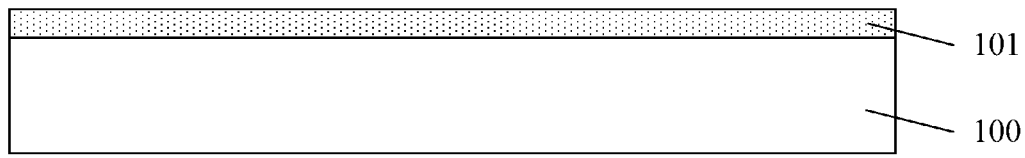
FIGS. 7-16 illustrate cross sectional structures of an exemplary interconnection structure corresponding to certain stages of an exemplary fabricating process in accordance with some embodiments of the disclosed subject matter.

FIG. 5 shows a schematic view of a wafer alignment during a photolithography process using the photoresist layer 60. FIG. 6 shows a schematic view of the relative positions of the formed plug va, the first to-be-connected member ma, and the second to-be-connected member ma+1.

In the photolithography process for patterning the photoresist layer 60, both wafer alignment and stacking offset compensation are performed based on an alignment mark 22 in a pattern that is used for subsequently forming the second to-be-connected member ma+1.

During the process for forming the second to-be-connected member ma+1, there is often an overlay shift between the second to-be-connected member ma+1 and the first to-be-connected member ma due to a process variation. There is a first stacking offset OVL1 between the second to-be-connected member ma+1 and the first to-be-connected member ma. Similarly, during the process for forming the plug va, there is a second stacking offset OVL2 between the plug va and the second to-be-connected member ma+1.

Therefore, the finally formed stacking offset amount OVL3 between the plug va and the first to-be-connected member ma may be a superposition of the first stacking offset amount OVL1 and the second stacking offset amount OVL2. As such, the stacking offset amount OVL3 between the plug va and the first to-be-connected member ma can be significant to cause a problem of bridging or even short-circuiting, which can affect the performance of the formed semiconductor device.

In order to solve the above discussed technical problems, the disclosed subject matter provides an interconnection structure, a method for fabricating the interconnection structure, and an exposure alignment system used for fabricating the interconnection structure.

Figure 19:
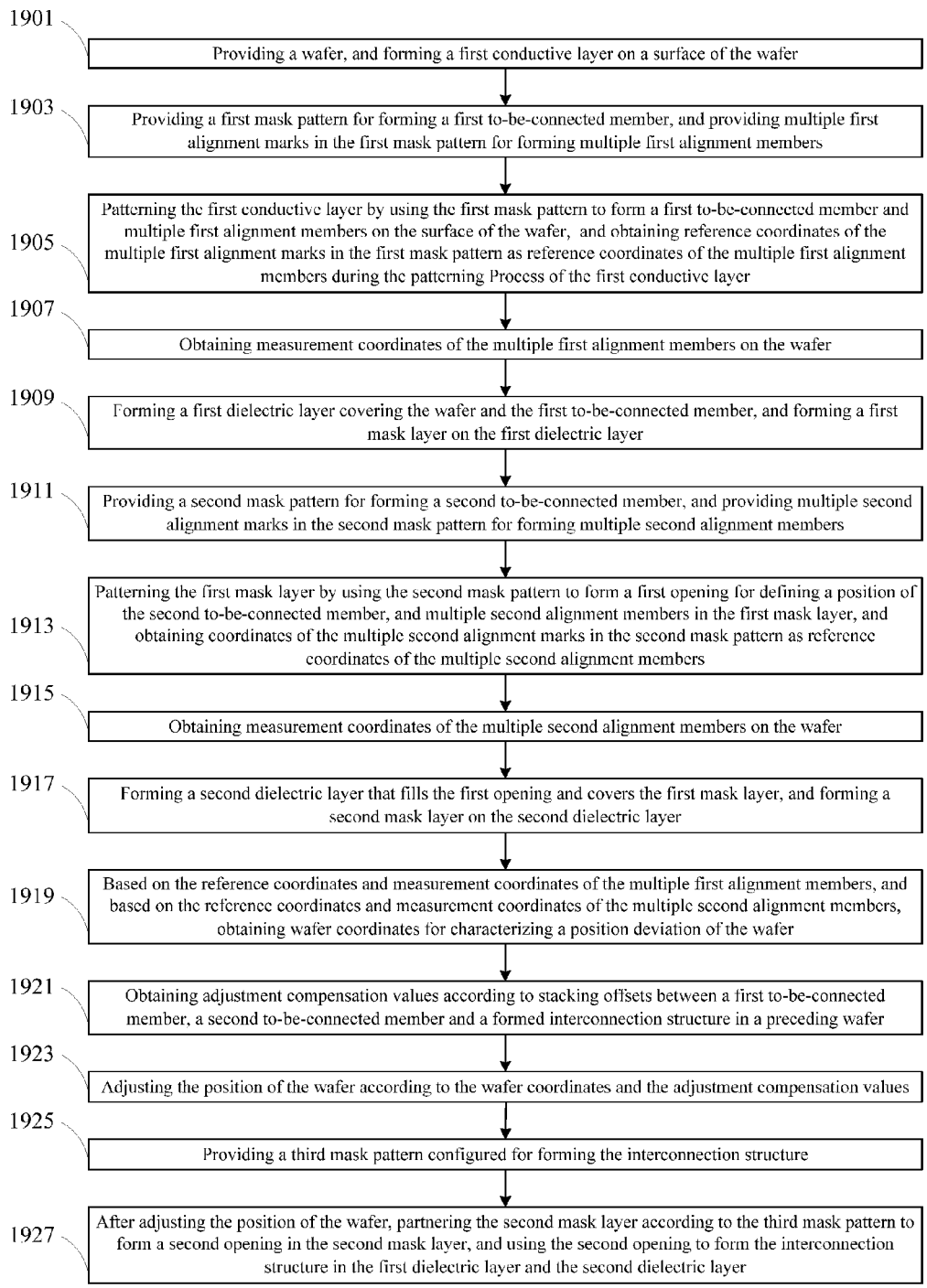
FIG. 19 illustrates a flow chart of an exemplary process for fabricating an interconnection structure in accordance with some embodiments of the disclosed subject matter.

Referring to FIG. 19, a flow chart of an exemplary process for fabricating an interconnection structure is shown in accordance with some embodiments of the disclosed subject matter. As illustrated, the disclosed fabricating method can include the following steps.

At step 1901, a wafer can be provided, and a first conductive layer can be formed on a surface of the wafer.

At step 1903, a first mask pattern for forming the first to-be-connected member can be provided, and multiple first alignment marks for forming multiple first alignment members can be provided in the first mask pattern.

At step 1905, the first conductive layer can be patterned by using the first mask pattern to form a first to-be-connected member and multiple first alignment members on the surface of the wafer. In the process of patterning the first conductive layer, coordinates of the multiple first alignment marks in the first mask pattern can be obtained and be used as reference coordinates of the multiple first alignment members.

At step 1907, the measurement coordinates of the multiple first alignment members on the wafer can be measured.

At step 1909, a first dielectric layer covering the wafer and the first to-be-connected member, and a first mask layer located on a surface of the first dielectric layer can be formed.

At step 1911, a second mask pattern for forming a second to-be-connected member can be provided. The second mask pattern can include multiple second alignment marks for forming multiple second alignment members.

At step 1913, the first mask layer can be patterned by using the second mask pattern to form a first opening and multiple second alignment members in the first mask layer. The first opening can be used to define a position of the second to-be-connected member. During the patterning process of the first mask layer, coordinates of the multiple second alignment marks in the second mask pattern can be obtained as reference coordinates of the multiple second alignment members.

At step 1915, the measurement coordinates of the multiple second alignment members on the wafer 100 can be measured.

At step 1917, a second dielectric layer that fills the first opening and covers the first mask layer can be formed, and a second mask layer can be formed on the second dielectric layer.

At step 1919, based on the reference coordinates and measurement coordinates of the multiple first alignment members, and based on the reference coordinates and measurement coordinates of the multiple second alignment members, the wafer coordinates can be obtained for characterizing a position deviation of the wafer.

At step 1921, adjustment compensation values can be obtained according to the stacking offsets between the first to-be-connected member, the second to-be-connected member and the formed interconnection structure in a preceding wafer.

At step 1923, the position of the wafer can be adjusted according to the wafer coordinates and the adjustment compensation values.

At step 1925, a third mask pattern used for forming the interconnection structure can be provided.

At step 1927, after adjusting the position of the wafer, the second mask layer can be patterned according to the third mask pattern to form a second opening in the second mask layer. Using the second opening, the interconnection structure can be formed in the first dielectric layer and the second dielectric layer.

In the disclosed fabricating method, during the exposure process for forming an interconnection structure, the wafer coordinates can be obtained to characterize the position of the wafer based on the reference coordinates and measurement coordinates of the first alignment member, and the reference coordinates and measurement coordinates of the second alignment member. During the process for forming the second opening in the second mask layer, the position of the wafer can be adjusted based on the obtained wafer coordinates. As such, the interconnection structure formed at the position defined by the second opening is capable to be desirably aligned to both of the first to-be-connected member and the second to-be-connected member. Therefore, the performance of the formed semiconductor device can be effectively improved, and the manufacturing yield of the semiconductor devices can be increased.

In the following, details of the interconnection structure, the method for fabricating the interconnection structure, and the exposure alignment system used for fabricating the interconnection structure are described in connection with the drawings.

Referring to FIGS. 7-16, cross sectional structures of an exemplary interconnection structure corresponding to certain stages of an exemplary fabricating process are shown in accordance with some embodiments of the disclosed subject matter.

Note that, a plug interconnecting a first to-be-connected member and a second to-be-connected member is used as an example to describe the disclosed embodiments, although other like interconnection structures may be used and included in the present disclosure.

Referring to 7, a wafer 100 can be provided, and a first conductive layer 101 is formed on a surface of the wafer 100 (step 1901 in FIG. 19).

The wafer 100 can be used as an operating platform for subsequent processes. In some embodiments, the wafer 100 can be made of any suitable semiconductor material. For example, a material of the wafer 100 can be selected from monocrystalline silicon, polysilicon, and amorphous silicon. As another example, a material of the wafer 100 can be selected from silicon, germanium, gallium arsenide, and silicon germanium compounds. As yet another example, the wafer 100 can have an epitaxial layer, or a silicon on epitaxial layer structure. In one embodiment, the material of the wafer 100 is silicon.

The first conductive layer 101 can be used for subsequently forming a first to-be-connected member. A material of the first conductive layer 101 can be any suitable conductive material. In a subsequent process, the first conductive layer 101 can be patterned to form the first to-be-connected member.

In one embodiment, the material of the first conductive layer 101 can be a metal. The first conductive layer 101 can be formed on the surface of the wafer 101 by using a chemical vapor deposition process.

Figure 8:
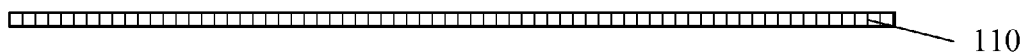
Figure 8:
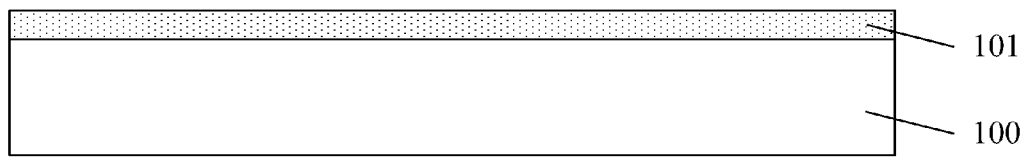

Referring to FIG. 8, a first mask pattern for forming the first to-be-connected member can be provided for a photomask, and multiple first alignment marks for forming a first alignment member can be provided in the first mask pattern (step 1903 in FIG. 19).

Specifically, in some embodiments, a first photomask 110 including a first mask pattern can be provided. The first mask pattern can include a first connecting member pattern that corresponds to a first to-be-connected member to be formed on the wafer. The first connecting member pattern can be used for patterning the first conductive layer 101 to form the first to-be-connected member.

In addition, the first mask pattern can further include multiple first alignment marks. In the process of patterning the first conductive layer 101 by using the first photomask 110, the multiple first alignment marks can be used for patterning the first conductive layer 101 to form multiple first alignment members.

In order to enable the exposure alignment in the subsequent semiconductor process, and in order to improve the accuracy of exposure alignment, a number of the first alignment marks in the first mask pattern is no less than three in accordance with some embodiments of the disclosed subject matter.

Figure 9:
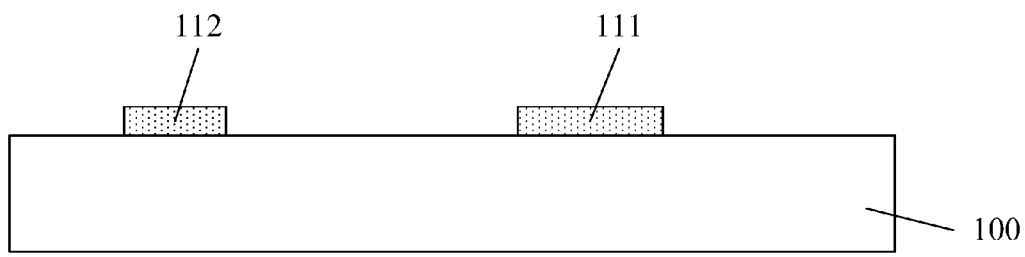

Referring to FIG. 9, the first conductive layer 101 can be patterned by the first mask pattern, a first to-be-connected member 111 and multiple first alignment members 112 can be formed on a surface of the wafer 100 (step 1905 in FIG. 19). In the process of patterning the first conductive layer 101, coordinates of the multiple first alignment marks in the first mask pattern can be obtained and be used as reference coordinates of the multiple first alignment members (step 1905 in FIG. 19).

Specifically, the first conductive layer 101 can be patterned by using the first photomask 110 including the first mask pattern. The first to-be-connected member 111 and the first alignment members 112 can be formed on the surface of the wafer 100.

In some embodiments, a process for patterning the first conductive layer 101 can include the following steps. Firstly, a first photoresist layer can be formed on the surface of the first conductive layer 101. Then, using the first photomask 110 as a mask, an exposing process and a developing process can be performed to the first photoresist layer to form a first mask pattern in the first photoresist layer. Next, using the first photoresist layer including the first mask pattern as a mask, the first conductive layer 101 can be etched to form the first to-be-connected member 111 and the multiple first alignment members 112.

In addition, during the exposure of the first photoresist layer, the coordinates of the multiple first alignment marks can be obtained as the reference coordinates of the multiple first alignment members respectively based on the first mask pattern in the first photomask 110. The reference coordinates of the multiple first alignment members are the coordinates of the first alignment members respectively formed without defects according to the multiple first alignment marks in the first mask pattern. That is, the reference coordinates of the multiple first alignment members are the coordinates of the multiple first alignment members formed according to the multiple first alignment marks in the first mask pattern under ideal process conditions (without any process defects).

In some embodiments, the reference coordinates of the multiple first alignment members can be obtained by using a simulation calculation to calculate the coordinates of the multiple first alignment members formed under the ideal process conditions based on the first mask pattern. In one embodiment, the reference coordinates of the multiple first alignment members can be represented by: $(X_{1,1}, Y_{1,1})$, $(X_{1,2}, Y_{1,2})$, $(X_{1,3}, Y_{1,3})$, . . . , $(X_{1,N}, Y_{1,N})$.

It should be noted that, since the first mask pattern includes at least three first alignment marks, a number of the multiple first alignment members formed on the surface of the wafer 100 is no less than three.

Still referring to FIG. 9, the measurement coordinates of the multiple first alignment members 112 on the wafer 100 can be measured (step 1907).

In some embodiments, after patterning the first conductive layer 101, the position coordinates of the multiple first alignment members 112 can be directly measured by a scanner of a lithography machine as the measurement coordinates of the multiple first alignment members: $(x_{1,1}, y_{1,1})$, $(x_{1,2}, y_{1,2})$, $(x_{1,3}, y_{1,3})$, . . . , $(x_{1,N}, y_{1,N})$.

Figure 10:
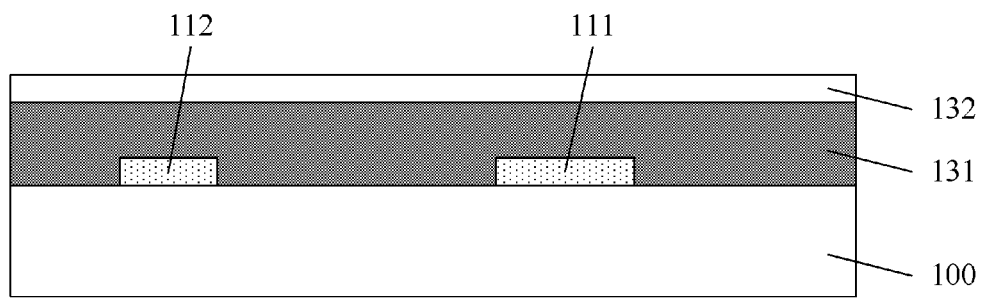

Referring to FIG. 10, a first dielectric layer 131 covering the wafer 100 and the first to-be-connected member 111, and a first mask layer 132 located on a surface of the first dielectric layer 131 can be formed (step 1909 in FIG. 19).

The first dielectric layer 131 can be used to achieve electrical isolation between different semiconductor devices. Specifically, a material of the first dielectric layer 131 may be selected from silicon oxide, silicon nitride, silicon oxynitride, a low-k dielectric material (dielectric constant greater than or equal to 2.5 but less than 3.9), an ultra-low K dielectric material (dielectric constant less than 2.5), and a combination thereof. In one embodiment, the material of the first dielectric layer 131 is silicon oxide.

Another opening for defining a position of a second to-be-connected member can be subsequently formed in the first mask layer 132. In one embodiment, a material of the first mask layer 132 is silicon nitride.

Figure 11:
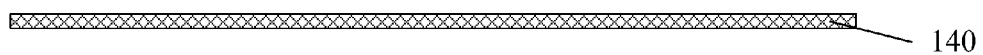

Referring to FIG. 11, a second mask pattern for forming a second to-be-connected member can be provided. The second mask pattern can include multiple second alignment marks for forming multiple second alignment members (step 1911 in FIG. 19).

In one embodiment, a second photomask 140 including a second mask pattern can be provided. The second mask pattern includes a second connecting member pattern corresponding to the second to-be-connected member. The second connecting member pattern can be used for patterning the first mask layer 132 to form a first opening in the first mask layer 132. The first opening can be used for defining a position of the second to-be-connected member.

In addition, the second mask pattern can further include multiple second alignment marks. In the process of patterning the first mask layer 132 by using the second photomask 140, the multiple second alignment marks can be used for patterning of the first mask layer 132 to form multiple second alignment members.

It should be noted that, in order to enable the exposure alignment in the subsequent semiconductor processes, a number of the multiple second alignment marks in the second mask pattern is equal to the number of the multiple first alignment marks in the first mask pattern. In one embodiment, the number of the multiple first alignment marks in the first mask pattern is no less than three, so that the number of the multiple second alignment marks in the second mask pattern is also no less than three.

Figure 12:
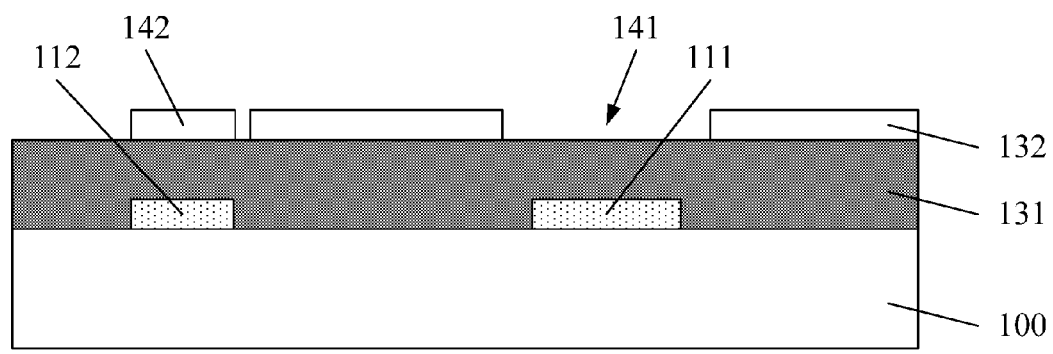

Referring to FIG. 12, the first mask layer 132 can be patterned by using the second mask pattern to form a first opening 141 and multiple second alignment members 142 in the first mask layer 132 (step 1913 in FIG. 19). The first opening 141 can be used to define a position of the second to-be-connected member. During the patterning process of the first mask layer 132, coordinates of the multiple second alignment marks in the second mask pattern can be obtained as reference coordinates of the multiple second alignment members 142 (step 1913 in FIG. 19).

Specifically, using the second photomask 140 including the second mask pattern, the first mask layer 132 can be patterned to form the first opening 141 and the multiple second alignment members 142 on the surface of the wafer 100.

In some embodiments, a process for patterning the first mask layer 132 can include the following steps. Firstly, a second photoresist layer can be formed on the surface of the first mask layer 132. Then, using the second photomask 140 as a mask, performing an exposing process and a developing process to the second photoresist layer to form a second mask pattern in the second photoresist layer. Next, using the second photoresist layer including the second mask pattern as a mask, etching the first mask layer 132 to form the first opening 141 and the multiple second alignment members 142.

In addition, during the exposure of the first mask layer, the coordinates of the multiple second alignment marks can be obtained as the reference coordinates of the multiple second alignment members respectively based on the second mask pattern in the second photomask 140. The reference coordinates of the multiple second alignment members are the coordinates of the second alignment members respectively formed without defect according to the multiple second alignment marks in the second mask pattern. That is, the reference coordinates of the multiple second alignment members are the coordinates of the multiple second alignment members formed according to the multiple second alignment marks in the second mask pattern under ideal process conditions (without any process defects).

In some embodiments, the reference coordinates of the multiple second alignment members can be obtained by using a simulation calculation to calculate the coordinates of the multiple second alignment members formed under the ideal process conditions based on the second mask pattern. In one embodiment, the reference coordinates of the multiple second alignment members can be represented by: $(X_{2,1}, Y_{2,1})$, $(X_{2,2}, Y_{2,2})$, $(X_{2,3}, Y_{2,3})$, ..., $(X_{2,N}, Y_{2,N})$.

It should be noted that, since the number of the multiple second alignment marks in the second mask pattern is equal to the number of the multiple first alignment marks in the first mask pattern, which is no less than three, a number of the multiple second alignment members 142 formed on in the first mask layer 132 is equal to the number of the multiple first alignment members 112, which is also no less than three.

Still referring to FIG. 12, the measurement coordinates of the multiple second alignment members 142 on the wafer 100 can be measured (step 1915 in FIG. 19).

In some embodiments, after patterning the first mask layer 132, the position coordinates of the multiple second alignment members 142 can be directly measured by a scanner of a lithography machine as the measurement coordinates of the multiple second alignment members: $(x_{2,1}, y_{2,1})$, $(x_{2,2}, y_{2,2})$, $(x_{2,3}, y_{2,3})$, ..., $(x_{2,N}, y_{2,N})$.

Figure 13:
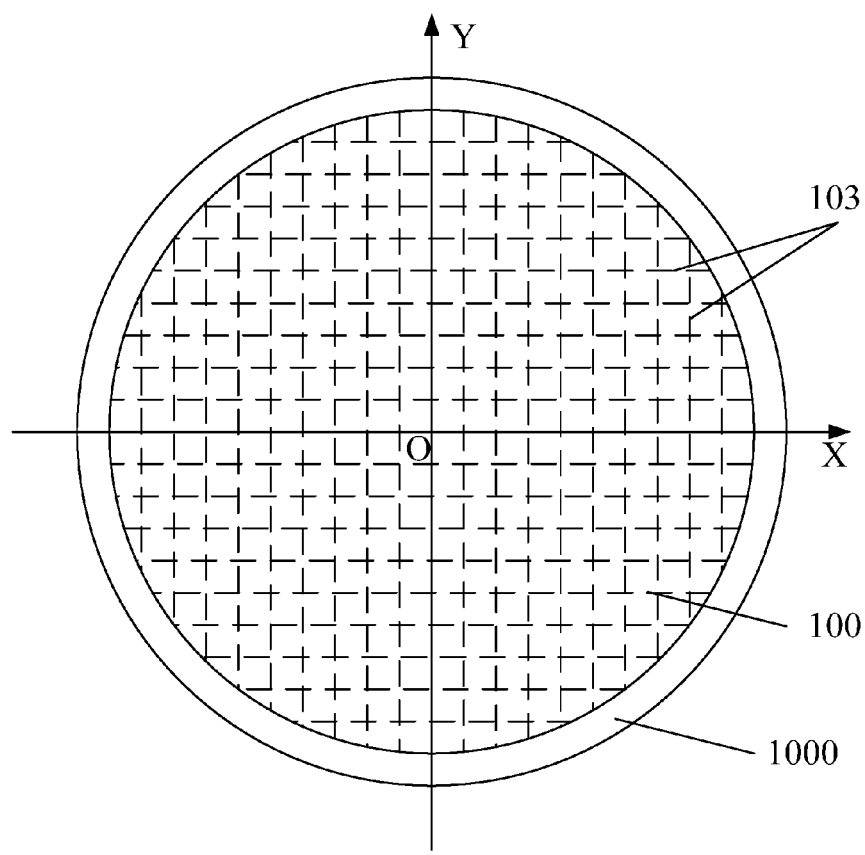

Referring to FIG. 13, during a process for forming the interconnection structure, the wafer 100 can be disposed on a wafer stage 1000. Multiple dicing lines 103 can be provided on the wafer 100. Using the center of the wafer stage 1000 as an origin point, and using two lines in the plane of the wafer stage 1000 that are respectively parallel to the multiple dicing lines 103 in perpendicular direction as an X axis and a Y axis, a wafer stage coordinate system can be established.

In some embodiments, the reference coordinates and measurement coordinates of the multiple first alignment members 112, and the reference coordinates and the measurement coordinates of the multiple second alignment members 142 can be represented by using the wafer stage coordinate system.

Figure 14:
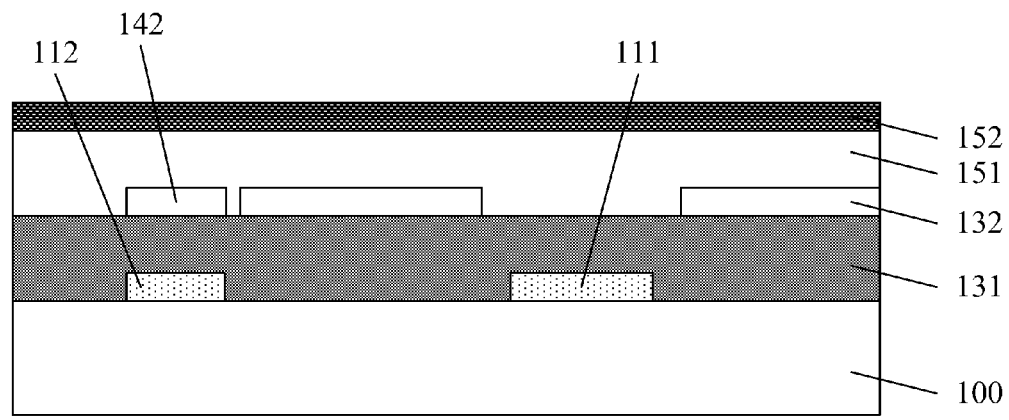

Referring to FIG. 14, a second dielectric layer 151 that fills the first opening and covers the first mask layer 132 can be formed, and a second mask layer 152 can be formed on the second dielectric layer 151 (step 1917 in FIG. 19).

The second dielectric layer 151 can be used to achieve electrical isolation between different semiconductor devices. In one embodiment, a material of the second dielectric layer 151 is silicon oxide. The second dielectric layer 151 can be formed by using a chemical vapor deposition process, a physical vapor deposition process, or an atomic layer deposition process.

The second mask layer 152 can be used to form a second opening to define a position of an interconnection structure that can interconnect the first to-be-connected member 111 and the second to-be-connected member. In one embodiment, a material of the second mask layer 152 is silicon nitride.

Next, based on the reference coordinates and measurement coordinates of the multiple first alignment members 112, and based on the reference coordinates and measurement coordinates of the multiple second alignment members 142, the wafer coordinates can be obtained for characterizing a position deviation of the wafer 100 (step 1919 in FIG. 19).

The steps of obtaining the coordinates of the wafer 100 can include: firstly, establishing a set of linear equations based on the reference coordinates and the measurement coordinates of the multiple first alignment members 112, the reference coordinates and the measurement coordinates of the multiple second alignment members 142, and wafer coordinates of the wafer 100; then, obtaining the wafer coordinates by solving the set of linear equations.

It should be noted that, the offset between the wafer 100 and the wafer stage normally includes a lateral shift, an enlargement, and a rotation. Therefore, the wafer coordinates can include a lateral coordinate T, an enlarged coordinate E, and a rotational coordinate R.

The lateral coordinate T(x, y) indicates a displacement between the center of the wafer 100 and the wafer coordinates system due to a lateral shift of the wafer 100 on the wafer stage 1000 in a certain direction. The rotational coordinate R(x, y) indicates a rotational angle between the wafer 100 and the wafer coordinates system due to a rotation of the wafer 100 on the wafer stage 1000. The enlargement coordinate E(x, y) indicates a vertical spacing between the wafer 100 and the wafer stage. After patterning of the second mask layer 152, the vertical spacing between the wafer 100 and the wafer stage can cause the second opening formed in the second mask layer 152 to be enlarged or to be reduced.

Specifically, in some embodiments, based on the reference coordinates of the multiple first alignment members $(X_{1,1}, Y_{1,1}), (X_{1,2}, Y_{1,2}), (X_{1,3}, Y_{1,3}), \ldots, (X_{1,N}, Y_{1,N})$, the measurement coordinates of the multiple first alignment members: $(x_{1,1}, y_{1,1}), (x_{1,2}, y_{1,2}), (x_{1,3}, y_{1,3}), \ldots, (x_{1,N}, y_{1,N})$, the reference coordinates of the multiple second alignment members can be represented by: $(X_{2,1}, Y_{2,1}), (X_{2,2}, Y_{2,2}), (X_{2,3}, Y_{2,3}), \ldots, (X_{2,N}, Y_{2,N})$, the measurement coordinates of the multiple second alignment members: $(x_{2,1}, y_{2,1}), (x_{2,2}, y_{2,2}), (x_{2,3}, y_{2,3}), \ldots, (x_{2,N}, y_{2,N})$, and the wafer coordinates T(x,y), E(x,y), and R(x,y), the following linear equations can be established:

$$\begin{pmatrix} X_{1,1} & X_{1,1} & X_{1,1} \\ X_{1,2} & X_{1,2} & X_{1,2} \\ \vdots & \vdots & \vdots \\ X_{1,N} & X_{1,N} & X_{1,N} \\ X_{2,1} & X_{2,1} & X_{2,1} \\ X_{2,2} & X_{2,2} & X_{2,2} \\ \vdots & \vdots & \vdots \\ X_{2,N} & X_{2,N} & X_{2,N} \end{pmatrix} \times \begin{pmatrix} T_x \\ E_x \\ R_x \end{pmatrix} = \begin{pmatrix} x_{1,1} \\ x_{1,2} \\ \vdots \\ x_{1,N} \\ x_{2,1} \\ x_{2,2} \\ \vdots \\ x_{2,N} \end{pmatrix}$$

Note that, the above set of linear equations uses X coordinates. Another set of linear equation using Y coordinates can be established in a similar way.

After establishing the linear equations, the wafer coordinates can be obtained by solving the linear equations. Specifically, in some embodiments, the set of linear equations can be solved by using a least squares method to obtain the wafer coordinates: t(x, y), e(x, y), and r(x, y).

Since the wafer coordinates are calculated based on the reference coordinates and measurement coordinates of the multiple first alignment members 112 as well as the reference coordinates and measurement coordinates of the multiple second alignment members 142, the wafer coordinates can include both the offset of the wafer 100 during the formation of the first to-be-connected member 111, and the offset of the wafer 100 during the formation of the second to-be-connected member.

The position of the wafer 100 can be subsequently adjusted in accordance with the wafer coordinates to compensate the offset of the wafer 100 during the formation of the first to-be-connected member 111 and also to compensate the offset of the wafer 100 during the formation of the second to-be-connected member. As such, the alignment of the formed interconnection structure with the first to-be-connected member 111 and the second to-be-connected member can be effectively improved. Therefore, the performance of the formed semiconductor device can be improved, and the manufacturing yield of the semiconductor devices can be improved.

Next, adjustment compensation values can be obtained according to the stacking offsets between the first to-be-connected member, the second to-be-connected member and the formed interconnection structure in a preceding wafer (step 1921 in FIG. 19).

The adjustment compensation values can include the following components: a wafer lateral shift adjustment compensation value $t^x$, a wafer enlargement adjustment compensation value $e^x$, a wafer rotation adjustment compensation value $r^x$, a single exposure rotation compensation value sr, and a single exposure enlargement compensation value sm.

The wafer lateral shift adjustment compensation value $t^x$ can be used to compensate a horizontal displacement between the wafer and the wafer stage in a linear direction in the wafer stage plane. The wafer enlargement adjustment compensation value $e^x$ can be used to compensate a vertical displacement between the wafer and the wafer stage in a direction perpendicular to the wafer stage plane. The wafer rotation adjustment compensation value $r^x$ can be used to compensate a rotational angle between the wafer and the wafer stage.

The single exposure rotation compensation value sr can be used to compensate a rotational angle between the wafer and the wafer stage during each exposure process. The single exposure enlargement compensation value sm can be used to compensate a vertical displacement between the wafer and the wafer stage in the direction perpendicular to the wafer stage plane during each exposure process.

A process for obtaining the adjustment compensation values can include the following steps.

Step a1: measuring a first stacking offset between the interconnection structure formed in a preceding wafer and the first to-be-connected member in the preceding wafer, and measuring a second stacking offset between the interconnection structure in the preceding wafer and the second to-be-connected member in the preceding wafer.

Specifically, in some embodiments, after forming the interconnection structure and the second to-be-connected member in the preceding wafer, the first stacking offset between the interconnection structure and the first to-be-connected member, and the second stacking offset between the interconnection structure and the second to-be-connected member can be directly measured by an overlapping pair measuring instrument of the photolithography machine.

Step a2, the adjustment compensation values can be obtained based on the first stacking offset and the second stacking offset.

Specifically, in some embodiments, the adjustment compensation values can be obtained based on the first stacking offset and the second stacking offset by using an advanced process control (APC) system.

It should be noted that, when the wafer 100 is the first wafer processed by the disclosed method, the adjustment compensation values can be default values since there is no preceding wafer can be used for obtaining the adjustment compensation values.

Specifically, in one embodiment, the default values of the adjustment compensation values can all be zero. However, in order to improve the manufacturing yield of semiconductor devices, after completing the exposure to the first wafer exposure, the first wafer may be cleaned to remove the exposed photoresist, and then be coated and exposed again to obtain a better aligned semiconductor structure.

Thereafter, the position of the wafer 100 can be adjusted according to the wafer coordinates and the adjustment compensation values (step 1923 in FIG. 19).

Specifically, in some embodiments, the lithography machine used in the disclosed method can include a mechanical control portion. The mechanical control portion can adjust the position of the wafer 100 according to the wafer coordinates and the adjustment compensation values.

Figure 15:

Referring to FIG. 15, a third mask pattern used for forming the interconnection structure can be provided (step 1925 in FIG. 19).

In some embodiments, a third photomask 160 including the third mask pattern can be provided. The third mask pattern corresponds to the interconnection structure that is used for realizing an electrical interconnection between the first to-be-connected member 111 and the second to-be-connected member.

Figure 16:
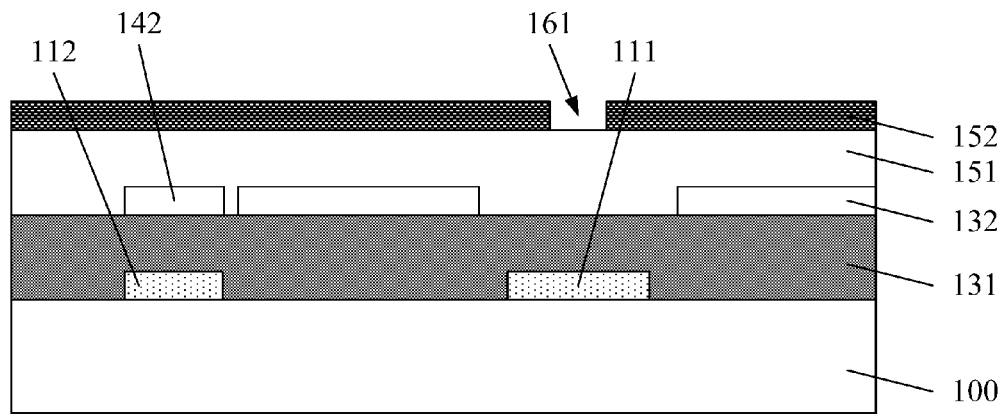

Referring to FIG. 16, after adjusting the position of the wafer 100, the second mask layer 152 can be patterned according to the third mask pattern to form a second opening 161 in the second mask layer 152 (step 1927 in FIG. 19). The second opening 161 can be used to form the interconnection structure in the first dielectric layer 151 and the second dielectric layer 131.

Specifically, using the third photomask 160 including the third mask pattern, the second mask layer 152 can be patterned to form the second opening 161 in the second mask layer 152. A process for patterning the second mask layer 152 can include the following steps. Firstly, a third photoresist layer can be formed on the surface of the second mask layer 152. Then, using the third photomask 160 as a mask, the third photoresist layer can be exposed and developed to form the second opening 161 in the second mask layer 152. The second opening 161 can be used for defining the position of the interconnection structure.

After that, using the second mask layer 152 as a mask, the second dielectric layer 151 and the first dielectric layer 131 can be etched to form a third opening at the position of the second opening 161. The interconnection structure can then be formed by filling the fourth opening.

In the disclosed method, the position of the wafer 100 can be adjusted before forming the second opening 161 that defines the position of the interconnection structure. In the position adjustment of the wafer 100, the alignment relationship with the first to-be-connected member 111 and the alignment relationship with the second to-be-connected member can be simultaneously considered. As such, the formed interconnection structure based on the second opening 161 can have a desired alignment relationships with both of the first to-be-connected member 111 and the second to-be-connected member. Accordingly, the performance of the formed semiconductor device can be improved, and the manufacturing yield of semiconductor devices can be increased.

Another aspect of the disclosed subject matter provides an exposure alignment system configured for realizing an exposure alignment during a formation of an interconnection structure on a wafer.

The wafer 300 can include a first conductive layer patterned in accordance with a first mask pattern, and a first mask layer patterned in accordance with a second mask pattern.

The first mask pattern can include multiple first alignment marks for forming multiple first alignment members. A first to-be-connected member and a first alignment member can be formed in the patterned first conductive layer.

The second mask pattern can include multiple second alignment marks for forming multiple second alignment members. A first opening and multiple second alignment members can be formed in the patterned first mask layer. The first opening can be used to define a position of a second to-be-connected member.

The wafer further includes a second mask layer on the first mask layer. The disclosed exposure alignment system is configured for realizing an exposure alignment during a formation of a second opening in the second mask layer. The second opening is used for defining a position of the interconnection structure.

The disclosed exposure alignment system can include a wafer module configured for: obtaining coordinates of multiple first alignment marks in a first mask pattern as reference coordinates of multiple first alignment members during a patterning process of a first conductive layer; obtaining coordinates of multiple second alignment marks in a second mask pattern as reference coordinates of multiple second alignment members during a patterning process of a first mask layer; measuring position coordinates of the multiple first alignment members as measurement coordinates of the multiple first alignment members after patterning the first conductive layer; measuring position coordinates of the multiple second alignment members as measurement coordinates of the multiple second alignment members after patterning the first mask layer; and obtaining wafer coordinates based on the reference coordinates and the measurement coordinates of the multiple first alignment members, and the reference coordinates and the measurement coordinates of the multiple second alignment members.

The disclosed exposure alignment system can further include a compensation module configured for obtaining adjustment compensation values according to the stacking offsets between the first to-be-connected member, the second to-be-connected member and the formed interconnection structure in a preceding wafer.

The disclosed exposure alignment system can further include a control module configured for: receiving the wafer coordinates and the adjustment compensation values from the wafer module and the compensation module; and adjusting the position of the wafer based on the wafer coordinates and the adjustment compensation values.

Figure 17:
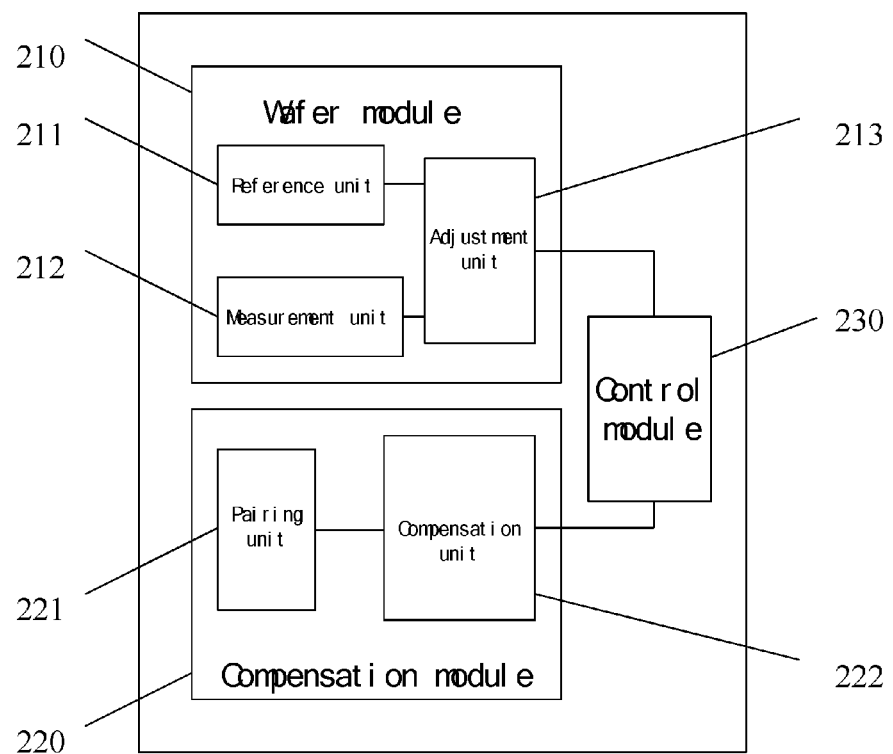
FIGS. 17 and 18 illustrate schematic view of an exemplary exposure alignment system in accordance with some embodiments of the disclosed subject matter.

Referring to FIG. 17, a functional block diagram of an exemplary exposure alignment system is shown in accordance with some embodiments of the disclosed subject matter.

Noted that, the exposure alignment system can be used to achieve exposure alignment during formation of an interconnection structure within a wafer.

The interconnection structure can be used to realize an electrical interconnection between a first to-be-connected member and a second to-be-connected member.

Figure 18:
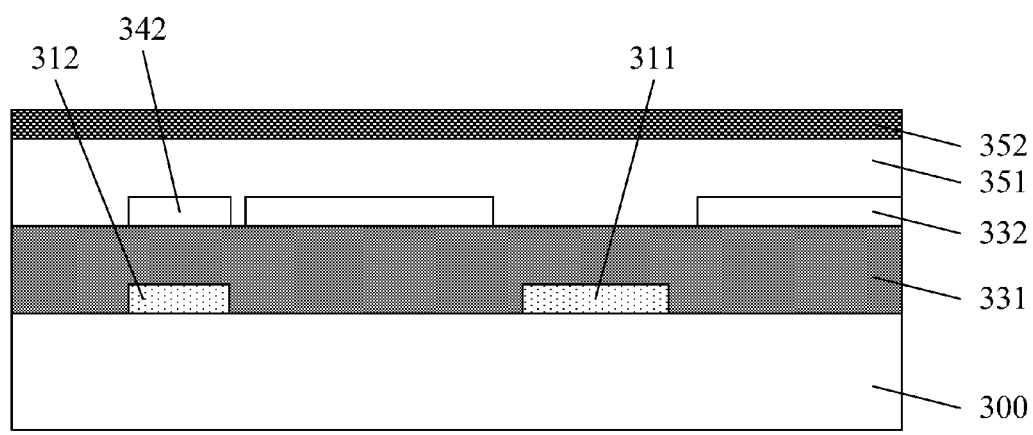

Referring to FIG. 18, a structural schematic diagram of a wafer processed by an exemplary exposure alignment system is shown in accordance with some embodiments of the disclosed subject matter.

As illustrated, a wafer 300 can include a first conductive layer (not shown) patterned in accordance with a first mask pattern on the surface of the wafer 300. The first mask pattern can include multiple first alignment marks for forming multiple first alignment members.

A first to-be-connected member 311 and a first alignment member 312 can be formed in the patterned first conductive layer. A first dielectric layer 331 is formed to cover the first to-be-connected member 311, the first alignment member 312, and the wafer 300.

A first mask layer 332 patterned in accordance with a second mask pattern can be formed on the surface of the first dielectric layer 331. The second mask pattern can include multiple second alignment marks for forming multiple second alignment members. A first opening (not shown) and multiple second alignment members 342 can be formed in the patterned first mask layer 332. The first opening can be used to define a position of a second to-be-connected member.

A second dielectric layer 351 can be formed for filling the first opening and covering the first mask layer 332 and the first dielectric layer 331. A second mask layer 352 can be formed on the second dielectric layer 351.

In some embodiments, in order to enable the exposure alignment in the subsequent semiconductor process, and in order to improve the accuracy of exposure alignment, the first mask pattern includes at least three first alignment marks, thus a number of the multiple first alignment members 312 formed on the surface of the wafer 300 is no less than three.

Further, in order to enable the exposure alignment in the subsequent semiconductor processes, a number of the multiple second alignment marks in the second mask pattern is equal to the number of the multiple first alignment marks in the first mask pattern. In some embodiments, the number of the multiple first alignment marks in the first mask pattern is no less than three, so that the number of the multiple second alignment marks in the second mask pattern is also no less than three. A number of the multiple second alignment members 342 formed on in the first mask layer 332 is equal to the number of the multiple first alignment members 312, which is also no less than three.

It should be noted that, the disclosed exposure alignment system can be used to form a second opening in the second mask layer 352 for defining a position of the interconnection structure.

Turning back to FIG. 17, the disclosed exposure alignment system can include the following components.

A wafer module 210 is configured for obtaining coordinates of multiple first alignment marks in a first mask pattern as reference coordinates of multiple first alignment members during a patterning process of a first conductive layer, and obtaining coordinates of multiple second alignment marks in a second mask pattern as reference coordinates of multiple second alignment members during a patterning process of a first mask layer.

The wafer module 210 is further configured for measuring position coordinates of the multiple first alignment members as measurement coordinates of the multiple first alignment members after patterning the first conductive layer, and measuring position coordinates of the multiple second alignment members as measurement coordinates of the multiple second alignment members after patterning the first mask layer.

The wafer module 210 is further configured for obtaining wafer coordinates based on the reference coordinates and the measurement coordinates of the multiple first alignment members, and the reference coordinates and the measurement coordinates of the multiple second alignment members.

Specifically, the wafer module 210 can include the following units.

A reference unit is configured for obtaining the coordinates of the multiple first alignment marks in the first mask pattern as the reference coordinates of the multiple first alignment members during the patterning process of the first conductive layer, and obtaining the coordinates of the multiple second alignment marks in the second mask pattern as the reference coordinates of the multiple second alignment members during the patterning process of the first mask layer.

In some embodiments, a process for patterning the first conductive layer can include the following steps. Firstly, a wafer can be provided, and a first conductive layer can be formed on a surface of the wafer. Then a first photoresist layer can be formed on a surface of the first conductive layer. Using a first photomask including a first mask pattern as a mask, the first photoresist layer can be exposed and developed to form the first mask pattern in the first photoresist layer. Next, using the first photoresist layer including the first mask pattern as a mask, the first conductive layer can be etched to form a first to-be-connected member and multiple first alignment members.

The first mask pattern provided in the first photomask can include a first connecting member pattern that corresponds to the first to-be-connected member. The first connecting member pattern can be used for patterning the first conductive layer to form the first to-be-connected member. The first mask pattern can further include multiple first alignment marks that can be used for patterning the first conductive layer to form multiple first alignment members.

In some embodiments, during the exposure process of the first photoresist layer using the first photomask, the reference unit 211 can measure the coordinates of the multiple first alignment marks in the first mask pattern. The measured coordinates of the multiple first alignment marks can be used as the reference coordinates of the multiple first alignment members: $(X_{1,1}, Y_{1,1})$, $(X_{1,2}, Y_{1,2})$, $(X_{1,3}, Y_{1,3})$, . . . , $(X_{1,N}, Y_{1,N})$.

Note that, the reference coordinates of the multiple first alignment members are coordinates of the multiple first alignment members formed without any defect according to the multiple first alignment marks in the first mask pattern. That is, the reference coordinates of the multiple first alignment members are the coordinates of the multiple first alignment members formed under the ideal process conditions based on the first mask pattern.

In some embodiments, a process for patterning the first mask layer can include the following steps. Firstly, a second photoresist layer can be formed on a surface of the first mask layer. Then, using a second photomask as a mask, an exposing process and a developing process can be performed to the second photoresist layer to form a second mask pattern in the second photoresist layer. Next, using the second photoresist layer including the second mask pattern as a mask, the first mask layer can be etched to form a first opening and multiple second alignment members.

The second mask pattern provided in the second photomask can include a second connecting member pattern that corresponds to the second to-be-connected member. The second connecting member pattern can be used for patterning the first mask layer to form a first opening in the first mask layer. The first opening can be used for defining a position of the second to-be-connected member.

In addition, the second mask pattern can further include multiple second alignment marks. In the process of patterning the first mask layer by using the second photomask, the multiple second alignment marks can be used for patterning of the first mask layer to form multiple second alignment members.

In some embodiments, during the exposure process of the second photoresist layer using the second photomask, the reference unit 211 can measure the coordinates of the multiple second alignment marks in the second mask pattern. The measured coordinates of the multiple second alignment marks can be used as the reference coordinates of the multiple second alignment members: $(X_{2,1}, Y_{2,1})$, $(X_{2,2}, Y_{2,2})$, $(X_{2,3}, Y_{2,3})$, . . . , $(X_{2,N}, Y_{2,N})$.

Note that, the reference coordinates of the multiple second alignment members are coordinates of the multiple second alignment members formed without any defect according to the multiple second alignment marks in the second mask pattern. That is, the reference coordinates of the multiple second alignment members are the coordinates of the multiple second alignment members formed under the ideal process conditions based on the second mask pattern.

The wafer module 210 further includes a measurement unit 212 configured for measuring position coordinates of the multiple first alignment members as measurement coordinates of the multiple first alignment members after patterning the first conductive layer, and measuring position coordinates of the multiple second alignment members as measurement coordinates of the multiple second alignment members after patterning the first mask layer.

Specifically, after the first conductive layer has been patterned, the measurement unit 212 can directly measure the position coordinates of the multiple first alignment members as the measurement coordinates of the multiple first alignment members: $(x_{1,1}, y_{1,1})$, $(x_{1,2}, y_{1,2})$, $(x_{1,3}, y_{1,3})$, . . . , $(x_{1,N}, y_{1,N})$. Further, after the first mask layer has been patterned, the measurement unit 212 can directly measure the position coordinates of the multiple second alignment members as the measurement coordinates of the multiple second alignment members: $(x_{2,1}, y_{2,1})$, $(x_{2,2}, y_{2,2})$, $(x_{2,3}, y_{2,3})$, . . . , $(x_{2,N}, y_{2,N})$.

In some embodiments, the measurement unit 212 can be a scanner of a lithography machine used in the disclosed process.

In order to simplify the alignment process and to improve the process efficiency, the reference unit 211 and the measurement unit 212 can obtain the reference coordinates of the multiple first alignment members and the multiple second alignment members, and the measurement coordinates of the multiple first alignment members and the multiple second alignment members based on a same coordinate system.

Specifically, during the patterning process for the first conductive layer and the first mask layer, the wafer can be disposed on a wafer stage. Multiple dicing lines can be provided on the wafer. By using the center of the wafer stage as an origin point, and using two lines in the plane of the wafer stage that are respectively parallel to the multiple dicing lines in perpendicular direction as an X axis and a Y axis, a wafer stage coordinate system can be established. In some embodiments, the reference unit 211 and the measurement unit 212 can obtain the reference coordinates of the multiple first alignment members and the multiple second alignment members, and the measurement coordinates of the multiple first alignment members and the multiple second alignment members based on the wafer stage coordinate system.

The wafer module 210 further includes an adjustment unit 213 connecting with the reference unit 211 and the measurement unit 212. The adjustment unit 213 is configured for obtaining wafer coordinates for characterizing a position deviation of the wafer based on the reference coordinates and the measurement coordinates of the multiple first alignment members, and the reference coordinates and the measurement coordinates of the multiple second alignment members.

It should be noted that, the offset between the wafer and the wafer stage normally includes a lateral shift, an enlargement, and a rotation. Therefore, the wafer coordinates can include a lateral coordinate T, an enlarged coordinate E, and a rotational coordinate R.

The lateral coordinate T(x, y) indicates a displacement between the center of the wafer and the wafer coordinates system due to a lateral shift of the wafer on the wafer stage in a certain direction. The rotational coordinate R(x, y) indicates a rotational angle between the wafer and the wafer coordinates system due to a rotation of the wafer on the wafer stage. The enlargement coordinate E(x, y) indicates a vertical spacing between the wafer and the wafer stage. After patterning of the second mask layer, the vertical spacing between the wafer and the wafer stage can cause the second opening formed in the second mask layer to be enlarged or to be reduced.

Specifically, the adjustment unit 213 is connected with the reference unit 211 to receive the reference coordinates of the multiple first alignment members and the multiple second alignment members obtained by the reference unit 211. The adjustment unit 213 is further connected with the measurement unit 212 to receive the measurement coordinates of the multiple first alignment members and the multiple second alignment members obtained by the measurement unit 212.

Based on the reference coordinates and the measurement coordinates of the multiple first alignment members, the reference coordinates and the measurement coordinates of the multiple second alignment members, and the wafer coordinates, the adjustment unit 213 can establish the following linear equations:

$$\begin{pmatrix} X_{1,1} & X_{1,1} & X_{1,1} \\ X_{1,2} & X_{1,2} & X_{1,2} \\ \vdots & \vdots & \vdots \\ X_{1,N} & X_{1,N} & X_{1,N} \\ X_{2,1} & X_{2,1} & X_{2,1} \\ X_{2,2} & X_{2,2} & X_{2,2} \\ \vdots & \vdots & \vdots \\ X_{2,N} & X_{2,N} & X_{2,N} \end{pmatrix} \times \begin{pmatrix} T_x \\ E_x \\ R_x \end{pmatrix} = \begin{pmatrix} x_{1,1} \\ x_{1,2} \\ \vdots \\ x_{1,N} \\ x_{2,1} \\ x_{2,2} \\ \vdots \\ x_{2,N} \end{pmatrix}$$

Note that, the above set of linear equations uses X coordinates. Another set of linear equation using Y coordinates can be established in a similar way.

After establishing the linear equations, the adjustment unit 213 can further solve the linear equations to obtain the wafer coordinates. Specifically, in some embodiments, the set of linear equations can be solved by using a least squares method to obtain the wafer coordinates: t(x, y), e(x, y), and r(x, y).

Since the adjustment unit 213 can calculate the wafer coordinates based on the reference coordinates and measurement coordinates of the multiple first alignment members as well as the reference coordinates and measurement coordinates of the multiple second alignment members, the wafer coordinates can include both the offset of the wafer during the formation of the first to-be-connected member and the offset of the wafer during the formation of the second to-be-connected member.

Therefore, the position of the wafer can be subsequently adjusted in accordance with the wafer coordinates to compensate the offset of the wafer during the formation of the first to-be-connected member and also to compensate the offset of the wafer during the formation of the second to-be-connected member. As such, the alignment of the formed interconnection structure with the first to-be-connected member and the second to-be-connected member can be effectively improved. Accordingly, the performance of the formed semiconductor device can be improved, and the manufacturing yield of the semiconductor devices can be improved.

Still referring to FIG. 17, the disclosed exposure alignment system can further include a compensation module 220 configured for obtaining adjustment compensation values according to the stacking offsets between the first to-be-connected member, the second to-be-connected member and the formed interconnection structure in a preceding wafer.

The adjustment compensation values can include the following components: a wafer lateral shift adjustment compensation value $t^x$, a wafer enlargement adjustment compensation value $e^x$, a wafer rotation adjustment compensation value $r^x$, a single exposure rotation compensation value sr, and a single exposure enlargement compensation value sm.

The wafer lateral shift adjustment compensation value $t^x$ can be used to compensate a horizontal displacement between the wafer and the wafer stage in a linear direction in the wafer stage plane. The wafer enlargement adjustment compensation value $e^x$ can be used to compensate a vertical displacement between the wafer and the wafer stage in a direction perpendicular to the wafer stage plane. The wafer rotation adjustment compensation value $r^x$ can be used to compensate a rotational angle between the wafer and the wafer stage.

The single exposure rotation compensation value sr can be used to compensate a rotational angle between the wafer and the wafer stage during each exposure process. The single exposure enlargement compensation value sm can be used to compensate a vertical displacement between the wafer and the wafer stage in the direction perpendicular to the wafer stage plane during each exposure process.

Specifically, the compensation module 220 can include a pairing unit 221 configured for measuring a first stacking offset between the interconnect structure formed in a preceding wafer and the first to-be-connected member in the preceding wafer, and measuring a second stacking offset between the interconnect structure in the preceding wafer and the second to-be-connected member in the preceding wafer.

In some embodiments, after forming the interconnection structure and the second to-be-connected member in the preceding wafer, the pairing unit 221 can directly measure the first stacking offset between the interconnect structure and the first to-be-connected member, and the second stacking offset between the interconnect structure and the second to-be-connected member. In one embodiment, the pairing unit 221 can be an overlapping pair measuring instrument of the photolithography machine.

Further, the compensation module 220 can include a compensation unit 222 connected with the pairing unit 221. The compensation unit 222 can be configured for obtaining the adjustment compensation values based on the first stacking offset and the second stacking offset.

Specifically, the compensation unit 222 is connected with the pairing unit 221 for receiving the first stacking offset and the second stacking offset from the pairing unit 221. Based on the received first stacking offset and the second stacking offset, the compensation unit 222 can obtain the adjustment compensation values. In one embodiment, the compensation unit 222 is an advanced process control (APC) system.

Still referring to FIG. 17, the disclosed exposure alignment system can further include a control module 230 connected with the wafer module 210 and the compensation module 220. The control module 230 is configured for receiving the wafer coordinates and the adjustment compensation values, and for adjusting the position of the wafer based on the wafer coordinates and the adjustment compensation values.

Specifically, the control module 230 is connected with the wafer module 210 to receive the wafer coordinates, and is connected with the compensation module 220 to receive the adjustment compensation values. Based on the received wafer coordinates and the adjustment compensation values, the control module 230 can adjust the position of the wafer to achieve exposure alignment.

In some embodiments, the control module 230 can be a mechanical control portion of the lithography machine used in the disclosed process. The mechanical control portion can adjust the position of the wafer according to the wafer coordinates and the adjustment compensation values to achieve exposure alignment.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, an interconnection structure, a method for fabricating the interconnection structure, and an exposure alignment system used for fabricating the interconnection structure are provided.

In the disclosed method, during an exposure process for forming the interconnection structure, the wafer coordinates can be obtained to indicate a position deviation of the wafer based on the reference coordinates and the measurement coordinates of the first to-be-connected member and the second to-be-connected member.

Further, during the formation of the second opening, the position of the wafer can be adjusted based on the wafer coordinates. In the position adjustment of the wafer, the alignment relationship with the first to-be-connected member and the alignment relationship with the second to-be-connected member can be simultaneously considered.

As such, the formed interconnection structure based on the second opening can have a desired alignment relationships with both of the first to-be-connected member and the second to-be-connected member. Accordingly, the performance of the formed semiconductor device can be improved, and the manufacturing yield of semiconductor devices can be increased.

Although the disclosed subject matter has been described and illustrated in the foregoing illustrative embodiments, it is understood that one disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of one disclosure.

What is claimed is:

1. A method for fabricating an interconnection structure, comprising:
   providing a wafer, wherein a first conductive layer is formed on a surface of the wafer;
   patterning the first conductive layer to form a first to-be-connected member and a plurality of first alignment members in the first conductive layer;
   obtaining reference coordinates and measurement coordinates of the plurality of first alignment members;
   forming a first dielectric layer covering the wafer and the first to-be-connected member, and forming a first mask layer on the first dielectric layer;
   pattering the first mask layer to form a first opening and a plurality of second alignment members in the first mask layer, wherein the first opening is used to define a position of a second to-be-connected member;
   obtaining reference coordinates and measurement coordinates of the plurality of second alignment members;
   forming a second dielectric layer filling the first opening and covering the first mask layer, and forming a second mask layer on the second dielectric layer;
   based on the reference coordinates and the measurement coordinates of the plurality of first alignment members, as well as the reference coordinates and the measurement coordinates of the plurality of second alignment members, obtaining wafer coordinates for characterizing a position deviation of the wafer;
   obtaining adjustment compensation values according to stacking offsets between a first to-be-connected member, a second to-be-connected member and an interconnection structure of a preceding wafer;
   adjusting a position of the wafer according to the wafer coordinates and the adjustment compensation values;
   after adjusting the position of the wafer, patterning the second mask layer to form a second opening in the second mask layer; and
   using the second opening to form the interconnection structure in the first dielectric layer and the second dielectric layer, wherein the interconnection structure electrical interconnects the first to-be-connected member and the second to-be-connected member.

2. The method of claim 1, wherein:
   the first conductive layer is patterning by using a first photomask including a first mask pattern, wherein the first mask pattern including a first connecting pattern for forming the first to-be-connected member, and a plurality of first alignment marks for forming the plurality of first alignment members; and
   the first mask layer is patterning by using a second photomask including a second mask pattern, wherein the second mask pattern including a second connecting pattern for forming the first opening, and a plurality of second alignment marks for forming the plurality of second alignment members.

3. The method of claim 2, wherein:
   a number of the plurality of first alignment marks is equal to a number of the plurality of first alignment members, which is not less than three; and
   a number of the plurality of second alignment marks is equal to a number of the plurality of second alignment members, which is not less than three.

4. The method of claim 3, wherein:
   the number of the plurality of first alignment members is equal to the number of the plurality of second alignment members.

5. The method of claim 2, wherein:
   the reference coordinates of the plurality of first alignment members are obtained by measuring position coordinates of the plurality of first alignment marks in the first mask plate;
   the measurement coordinates of the plurality of first alignment members are obtained by measuring position coordinates of the plurality of first alignment members in the first conductive layer;
   the reference coordinates of the plurality of second alignment members are obtained by measuring position coordinates of the plurality of second alignment marks in the second mask plate; and
   the measurement coordinates of the plurality of second alignment members are obtained by measuring position coordinates of the plurality of second alignment members in the first mask layer.

6. The method of claim 5, wherein:
   the wafer is placed on a wafer stage, and a plurality of dicing lines are provided on the wafer;
   a wafer stage coordinate system is established by using a center of the wafer stage as an original point, and using two lines respectively parallel to two dicing lines that are perpendicular to each other an X axis and a Y axis; and
   the reference coordinates and the measurement coordinates of the plurality of first alignment members, and the reference coordinates and the measurement coordinates of the plurality of second alignment members are represented by using the wafer stage coordinate system.

7. The method of claim 6, wherein obtaining wafer coordinates comprises:
   establishing a set of linear equations based on the reference coordinates and the measurement coordinates of the plurality of first alignment members, the reference coordinates and the measurement coordinates of the plurality of second alignment members, and the wafer coordinates; and
   obtaining the wafer coordinates by solving the set of linear equations;
   wherein the wafer coordinates include at least a lateral coordinate, an enlarged coordinate, and a rotational coordinate.

8. The method of claim 7, wherein the set of linear equations are solved by using a least squares method.

9. The method of claim 7, wherein obtaining adjustment compensation values comprises:
   measuring a first stacking offset between the first to-be-connected member and the interconnection structure of the preceding wafer by using an overlapping pair measuring instrument;
   measuring a second stacking offset between the second to-be-connected member and the interconnection structure of the preceding wafer by using the overlapping pair measuring instrument; and obtaining the adjustment compensation values based on the first stacking offset and the second stacking offset by using an advanced process control system.

10. The method of claim 7, wherein the adjustment compensation values comprises:

a wafer lateral shift adjustment compensation value configured to compensate a horizontal displacement between the wafer and the wafer stage in a linear direction in a wafer stage plane;

a wafer enlargement adjustment compensation value configured to compensate a vertical displacement between the wafer and the wafer stage in a direction perpendicular to the wafer stage plane;

a wafer rotation adjustment compensation value configured to compensate a rotational angle between the wafer and the wafer stage;

a single exposure rotation compensation value configured to compensate a rotational angle between the wafer and the wafer stage during each exposure process; and a single exposure enlargement compensation value configured to compensate a vertical displacement between the wafer and the wafer stage in the direction perpendicular to the wafer stage plane during each exposure process.

11. An exposure alignment system configured for forming an interconnection structure, comprising:

a wafer module, configured for:

providing a wafer, wherein a first conductive layer is formed on a surface of the wafer;

patterning the first conductive layer to form a first to-be-connected member and a plurality of first alignment members in the first conductive layer;

obtaining reference coordinates and measurement coordinates of the plurality of first alignment members;

forming a first dielectric layer covering the wafer and the first to-be-connected member, and forming a first mask layer on the first dielectric layer;

pattering the first mask layer to form a first opening and a plurality of second alignment members in the first mask layer, wherein the first opening is used to define a position of a second to-be-connected member;

obtaining reference coordinates and measurement coordinates of the plurality of second alignment members;

forming a second dielectric layer filling the first opening and covering the first mask layer, and forming a second mask layer on the second dielectric layer; and obtaining wafer coordinates for characterizing a position deviation of the wafer based on the reference coordinates and the measurement coordinates of the plurality of first alignment members, as well as the reference coordinates and the measurement coordinates of the plurality of second alignment members;

a compensation module, configured for:

obtaining adjustment compensation values according to stacking offsets between a first to-be-connected member, a second to-be-connected member and an interconnection structure of a preceding wafer; and an adjustment module connected with the wafer module and the compensation module, configured for:

receiving the wafer coordinates from the wafer module;

receiving the adjustment compensation values from the compensation module; and adjusting a position of the wafer according to the wafer coordinates and the adjustment compensation values.

12. The exposure alignment system of claim 11, wherein the wafer module is further configured for:

after adjusting the position of the wafer, patterning the second mask layer to form a second opening in the second mask layer; and using the second opening to form the interconnection structure in the first dielectric layer and the second dielectric layer, wherein the interconnection structure electrical interconnects the first to-be-connected member and the second to-be-connected member.

13. The exposure alignment system of claim 11, wherein the wafer module is further configured for:

using a first photomask including a first mask pattern to pattern the first conductive layer, wherein the first mask pattern including a first connecting pattern for forming the first to-be-connected member, and a plurality of first alignment marks for forming the plurality of first alignment members; and using a second photomask including a second mask pattern to pattern the first mask layer, wherein the second mask pattern including a second connecting pattern for forming the first opening, and a plurality of second alignment marks for forming the plurality of second alignment members.

14. The exposure alignment system of claim 13, wherein:

a number of the plurality of first alignment marks is equal to a number of the plurality of first alignment members, which is not less than three;

a number of the plurality of second alignment marks is equal to a number of the plurality of second alignment members, which is not less than three; and the number of the plurality of first alignment members is equal to the number of the plurality of second alignment members.

15. The exposure alignment system of claim 14, wherein the wafer module comprises:

a reference unit configured for:

measuring position coordinates of the plurality of first alignment marks in the first mask plate as the reference coordinates of the plurality of first alignment members, and measuring position coordinates of the plurality of second alignment marks in the second mask plate as the reference coordinates of the plurality of second alignment members; and a measurement unit configured for:

measuring position coordinates of the plurality of first alignment members in the first conductive layer as the measurement coordinates of the plurality of first alignment members, and measuring position coordinates of the plurality of second alignment members in the first mask layer as the measurement coordinates of the plurality of second alignment members.

16. The exposure alignment system of claim 15, further comprising:

a wafer stage for placing the wafer, wherein a plurality of dicing lines are provided on the wafer;

wherein the wafer module is further configured for establishing a wafer stage coordinate system by using a center of the wafer stage as an original point, and using two lines respectively parallel to two dicing lines that are perpendicular to each other an X axis and a Y axis; and wherein the reference coordinates and the measurement coordinates of the plurality of first alignment members, and the reference coordinates and the measurement coordinates of the plurality of second alignment members are represented by using the wafer stage coordinate system.

17. The exposure alignment system of claim 16, wherein the wafer module is further configured for:
establishing a set of linear equations based on the reference coordinates and the measurement coordinates of the plurality of first alignment members, the reference coordinates and the measurement coordinates of the plurality of second alignment members, and the wafer coordinates; and
obtaining the wafer coordinates by solving the set of linear equations;
wherein the wafer coordinates include at least a lateral coordinate, an enlarged coordinate, and a rotational coordinate.

18. The exposure alignment system of claim 17, wherein the wafer module is further configured for solving the set of linear equations by using a least squares method.

19. The exposure alignment system of claim 17, wherein the compensation module is further configured for:
measuring a first stacking offset between the first to-be-connected member and the interconnection structure of the preceding wafer by using an overlapping pair measuring instrument;
measuring a second stacking offset between the second to-be-connected member and the interconnection structure of the preceding wafer by using the overlapping pair measuring instrument; and
obtaining the adjustment compensation values based on the first stacking offset and the second stacking offset by using an advanced process control system.

20. The exposure alignment system of claim 17, wherein the adjustment compensation values comprises:
a wafer lateral shift adjustment compensation value configured to compensate a horizontal displacement between the wafer and the wafer stage in a linear direction in a wafer stage plane;
a wafer enlargement adjustment compensation value configured to compensate a vertical displacement between the wafer and the wafer stage in a direction perpendicular to the wafer stage plane;
a wafer rotation adjustment compensation value configured to compensate a rotational angle between the wafer and the wafer stage;
a single exposure rotation compensation value configured to compensate a rotational angle between the wafer and the wafer stage during each exposure process; and
a single exposure enlargement compensation value configured to compensate a vertical displacement between the wafer and the wafer stage in the direction perpendicular to the wafer stage plane during each exposure process.

* * * * *